(12) United States Patent
Liao et al.

(10) Patent No.: US 11,532,466 B2
(45) Date of Patent: Dec. 20, 2022

(54) PART-LIFE ESTIMATION UTILIZING FEATURE METROLOGY

(71) Applicant: Applied Materials, Inc., Santa Clara, CA (US)

(72) Inventors: Chien-Min Liao, San Jose, CA (US); Yao-Hung Yang, Santa Clara, CA (US); Tom K. Cho, Los Altos, CA (US); Siamak Salimian, Los Altos, CA (US); Hsiu Yang, Santa Clara, CA (US); Chun-Chung Chen, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 255 days.

(21) Appl. No.: 16/933,922

(22) Filed: Jul. 20, 2020

(65) Prior Publication Data
US 2022/0020565 A1 Jan. 20, 2022

(51) Int. Cl.
*H01J 37/32* (2006.01)

(52) U.S. Cl.
CPC ..... *H01J 37/3288* (2013.01); *H01J 2237/335* (2013.01)

(58) Field of Classification Search
CPC .................................................. H01J 37/3288
See application file for complete search history.

(56) References Cited

PUBLICATIONS

U.S. Appl. No. 16/702,031, filed Dec. 3, 2019 Entitled "Method and system for improving the operation of semiconductor processing".

*Primary Examiner* — Joseph L Williams
(74) *Attorney, Agent, or Firm* — Patterson + Sheridan, LLP

(57) ABSTRACT

Certain embodiments provide a method and non-transitory computer readable medium having instructions that, when executed by a processor of a processing system, cause the processing system to perform a method for improving operation of a semiconductor processing system. The method of part life estimation generally includes obtaining a chamber part having a first surface portion and second surface portion. A data matrix in the first portion of the chamber part is read. The data matrix has raised features. The first portion of the chamber part is cleaned. Wear on the raised features is evaluated. The part is discarded in response to the wear on the raised feature.

20 Claims, 6 Drawing Sheets

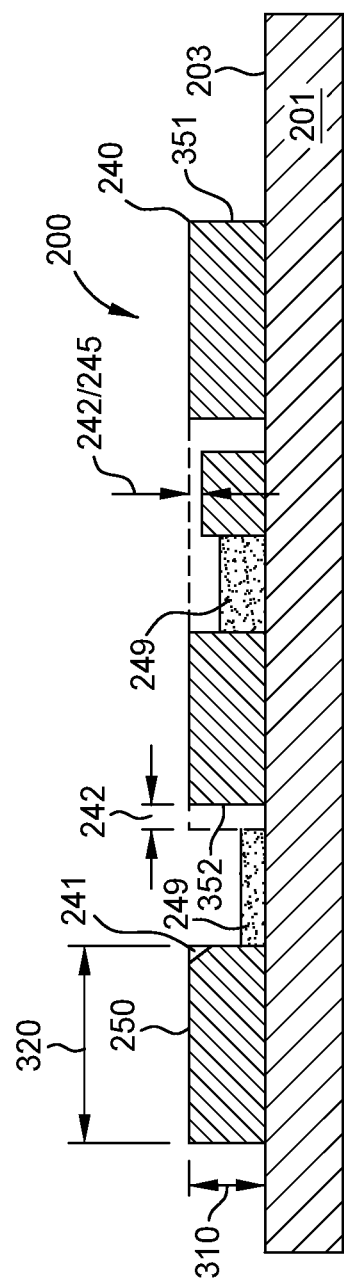
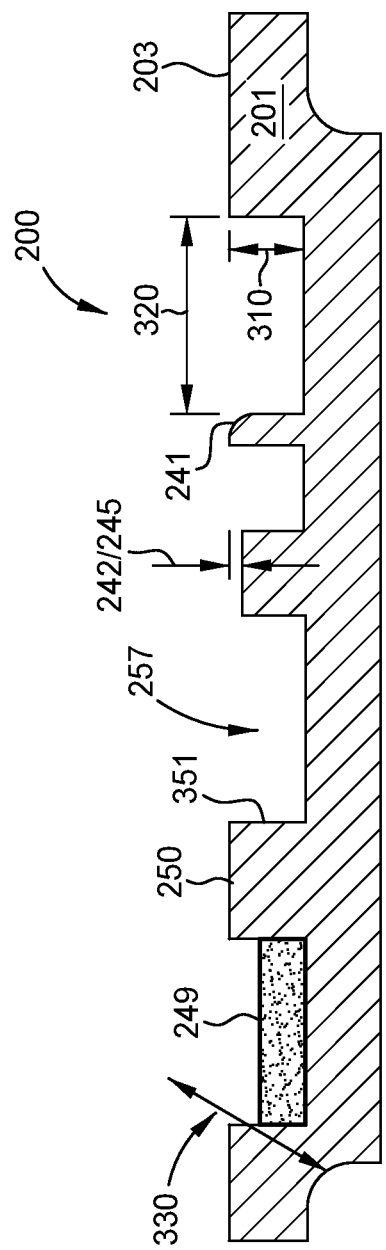
FIG. 3A
FIG. 3B

PART-LIFE ESTIMATION UTILIZING FEATURE METROLOGY

BACKGROUND

Field

Embodiments of the present invention generally relate to parts having tracking enabled features that are utilized in a semiconductor processing system and more particularly to improving the operation of a semiconductor processing system with part life tracking.

Description of the Related Art

Chamber components are utilized in a processing chamber of a semiconductor processing tool. The chamber components have a substantial impact on the performance characteristics of the tool. When the chamber components are in good condition early in their life, the processing performance of the chamber can be predictable, as the quality and performance of the chamber components are known. For example, a substrate is processed in the processing chamber and a number of devices are formed on the substrate. The devices have requirements that the features of the devices conform with critical dimensions as specified. The predictability of the processing chamber is necessary for ensuring the critical dimensions for the features can be properly formed.

However, over time after a number of operations are performed in the processing chamber, the chamber components begin to wear and the performance of the processing chamber become less predictable. The part wear and resulting less predictable performance eventually leads to the manufacture of devices on the substrates that do not meet specified critical dimensions and rejection of one or more devices on the substrate. The cost of the substrate in time and money is significant and to ensure the devices are properly formed on the substrate, the chamber components are replaced before they negatively impact production by the processing chamber.

Chamber components are replaced as they reach the end of their useful lives. There is no systematic way to estimate the remaining life of the chamber components. The chamber components are expensive to replace and additionally require downtime of the processing chamber that stops production and is expensive. The replacement of the chamber components are held off as long as feasible before the wear on the consumable part affects the performance of the processing chamber and devices on substrates are unable to meet required critical dimensions in their formation. Furthermore, maintaining the measured specification of each individual part is often lost as the parts are replaced and refurbished.

Therefore, there is a need for improved tracking of chamber part life and their performance to improve the operation of semiconductor processing tools, along with parts configures to enable the same.

SUMMARY

Certain embodiments provide a method and non-transitory computer readable medium having instructions that, when executed by a processor of a processing system, cause the processing system to perform a method for improving operation of a semiconductor processing system. The method of part life estimation generally includes obtaining a chamber part having a first surface portion and second surface portion. A data matrix in the first portion of the chamber part is read. The data matrix has raised features. The first portion of the chamber part is cleaned. Wear on the raised features is evaluated. The part is discarded in response to the wear on the raised feature.

In yet other embodiments, a chamber part for a semiconductor processing chamber is disclosed. The chamber part has a body having a first surface portion and second surface portion. A data matrix is formed in the first portion of the chamber part, wherein the data matrix has three dimensional (3D) features. The data matrix has a identification matrix code and a metrology code.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

FIGS. 3A and 3B depict a random cross-section of the data matrix of FIG. 2 disposed on a portion of the consumable part.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
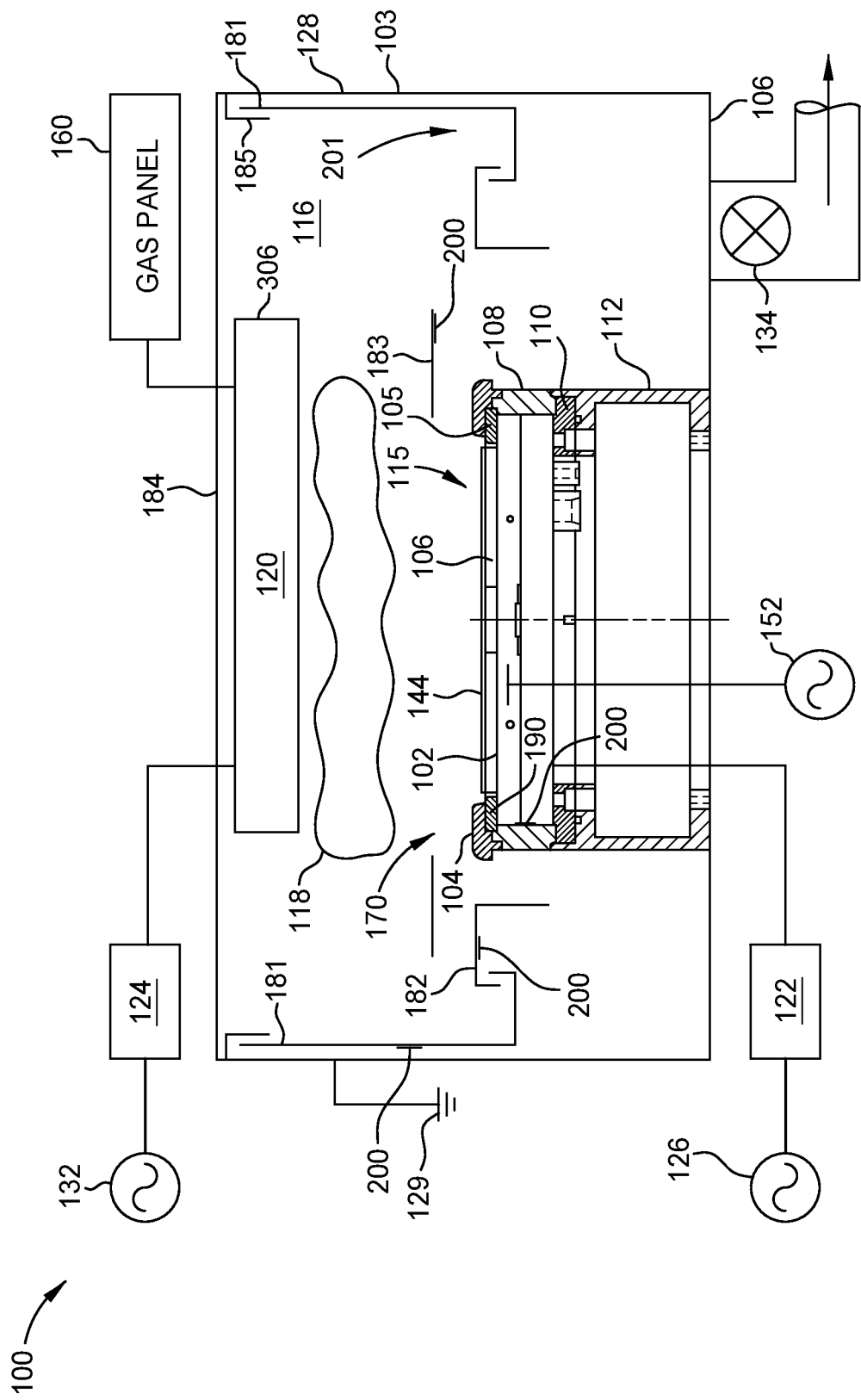
FIG. 1 is a schematic, cross sectional view of an exemplary processing chamber having chamber components.

As described in detail below, chamber components used in plasma processing systems may have standardized three dimensional (3D) features marked on them. The standardized features may be a raised, or recessed, code utilized to uniquely identify the part and additionally as a reference point for evaluating the quality and suitability of the chamber component for processing in the plasma processing system. The standardized features can be measured in one or more dimensions, depending on the geometry, to obtain a metric indicative of the remaining life of the chamber component. During post chamber processing, such as cleaning or refurbishment of the chamber component, these 3D standardized features can be used to infer the impact of further production used or further cleaning or refurbishment on the remaining life for the chamber component. By measuring and monitoring wear and other changes to these 3D features, an estimate of the remaining part life can be determined. Thus, a method to monitor part quality and estimate part life can be established along with a method to track and compare part-to-part variation based on the change in the physical structure of the standardized features marked on the chamber components. This enables the ability to monitor the tool condition through part life estimation.

This invention utilizes process sensitive 3D features, such as a code, marked on the chamber component, e. g., a multi-dimensional array [MDA] and/or data matrices [DM], to verify part specification and estimate the remaining part life. Using 3D "standardized" geometry for the features enables part to part comparison, along with increased accuracy of life predictability. On the standardized features, the profile can be measured to determine manufacturing quality encoding profile of the part. Post process or refurbishment, the same features could be measured to monitor the part process sensitivity and estimate remaining part life. Standard features on parts can be utilized as a reference point for evaluating part quality and process status features can be measured in single or multiple dimensions depending on the geometry. Post chamber process and cleaning/refurbishment, the same standard sized features can be used to trace the impact of these processes on the part. An estimate of the remaining part life can be determined by measuring and monitoring changes these feature.

When a manufacturer and/or supplier makes a new part, critical dimensions of the part can be measured and loaded into a database. In one example, a barcode generator software may be used to generate a unique code and a data matrix. Before parts are installed on the tool, the data matrix is scanned and associated with the tool. In the event that the tool process data is out of spec and requires troubleshooting, the part data matrix can be rescanned and measured to retrieve the part information and previously measured critical dimensions for evaluating the changes in the part.

Individual parts are manufactured to include the 3D standardized features such as a data matrix in the form of a multidimensional array. Metrology of the features in the data matrix may be used to capture critical dimensions and quality of the life remaining in the part. For example, these features may be measured to determine initial part quality. Post chamber processes and cleaning/refurbishment processes may measure the same features to decouple the impact of chamber processes from cleaning/refurbishment processes to determine the life and quality of the chamber part.

FIG. 1 is a schematic, cross sectional view of an exemplary processing chamber 100 having chamber components 201. While not discussed here in detail, the chamber components 201 are exposed to a processing environment that degrades the part life over time requiring routine cleaning and maintenance. The processing chamber 100 may be utilized alone or, as a processing module of an integrated semiconductor substrate processing system, or cluster tool. The exemplary processing chamber 100 is described below as one non-limiting example of a processing chamber 100 having non-limiting examples of chamber components 201. However, chamber component 201 may be found in other processing chambers having other chamber components geometry when the chamber components are replaced and have a surface exposed to a plasma during semiconductor processing operations performed in the processing chamber.

The processing chamber 100 has a body 128 coupled to a ground 129. The body 128 of the processing chamber 100 has sidewalls 103, a lid 184 and a bottom surface 109. The sidewalls 103, lid 184 and bottom surface 109 define an interior volume 116. The body 128 of the processing chamber 100 is a high vacuum vessel having the interior volume 116 coupled through a throttle valve (not shown) to a vacuum pump 134. A substrate support 115 is disposed in the interior volume 116. In operation, the substrate 144 is placed on the substrate support 115 and the interior volume 116 is pumped down to sub-atmospheric pressures.

A showerhead 120 is disposed proximate the lid 184 and within the interior volume 116. One or more gases are introduced from a gas panel 160 via the showerhead 120 into the interior volume 116 of the processing chamber 100. The showerhead 120 may be coupled to an RF power source 132 through a matching network 124. The gas from the showerhead 120 may be ignited into a plasma 118 in the interior volume 116 by applying the power from the RF power source 132 to the showerhead 120. The plasma may be used to etch a feature in a substrate 144 during processing and then pumped out of the processing chamber 100 through the vacuum pump 134.

The substrate support 115 is disposed below the showerhead 120. The substrate support 115 generally includes an electrostatic chuck (ESC) 102, a ring assembly 170 having a cover ring 104 and an edge ring 105, a cathode 106 to electrically bias the ESC 102, an insulator pipe 108, a pedestal insulator 110, and a pedestal support 112.

The insulator pipe 108 and the pedestal insulator 110 function to electrically isolate the sidewalls 103 and the substrate support 115, respectively, from the electrical bias applied to the ESC 102. The substrate support 115 may be biased by a DC power supply 152. An RF power source 126 may optionally be coupled to the substrate support 115 through a matching network 122.

The cover ring 104 may be a single piece ring that rests on the edge ring 105 and insulator pipe 108. The substrate 144, when placed onto the substrate support 115, will rest on the ESC 102 and be surrounded by the edge ring 105 and cover ring 104. Since the edge ring 105 and cover ring 104 also focuses the plasma, the edge ring 105 and cover ring 104 are usually made of silicon or quartz and consumed during processing. In one embodiment, the cover ring 104 is formed from a quartz material and the edge ring 105 is formed from a silicon containing material. In plasma etch chambers, the cover ring 104 and edge ring 105 protects the ESC 102 from erosion by the plasma as well as controlling the distribution of the plasma near the edge of the substrate 144 during processing. To prevent process drift due to erosion of the cover ring 104 and edge ring 105, the edge ring 105 and/or cover ring 104 incorporates structures for monitoring the wear of the edge ring 105.

The processing chamber 100 also contains a process kit 150 which comprises various components that can be easily removed from the chamber 100, for example, to clean sputtering deposits off the component surfaces, replace or repair eroded components, or to adapt the chamber 100 for other processes. The process kit 150 includes a one-piece lower shield 160, an interleaving cover ring 170, a deposition ring 180, and a middle shield 190. In one embodiment, the process kit 150 comprises a lower shield 182, a middle shield 181, an upper shield 1185 and a ring assembly 170 for placement about a peripheral wall 138 of the substrate support 115 that terminates before an overhanging edge 107 of the substrate 144.

Chamber components 201 have a data matrix 200 formed thereon. For example, the data matrix 200 is provided on each of the one-piece lower shield 160, the interleaving cover ring 170, the deposition ring 180, the middle shield 190, the substrate support 115, showerhead 120, edge ring 105, etc. The data matrix 200 is 3 dimensional, i.e., having raised or lowered structures relative to the adjacent surface of the chamber component 201. The data matrix 200 is formed from the same material as the chamber component 201. The data matrix 200 may be laser etched, stamped, cast, printed, milled, engraved, formed by EDM or by other suitable techniques on the chamber components 201. The data matrix 200 has a portion that functions as a metrology feature formed in a plasma/process facing area exposed to the interior volume 116. The data matrix 200 is formed in a manner that decouples the effect of wafer processing from measuring the life of the chamber component 201 by not interfering with the plasma profile, ground or the process performance of the chamber components 201. Alternately, the data matrix 200 may be formed on a non-plasma facing surface. In yet other embodiments, the data matrix 200 may be formed on both plasma and non-plasma facing surfaces. Additionally, the data matrix 200 may be formed in several locations on the chamber component 201 having axial symmetry to determine symmetry of the process or wear on the chamber component 201. It should be appreciated that the data matrix 200 on a chamber component 201 does not form features that mate with another chamber component or intended to interfere with the processing in the chamber but merely to show evidence of part wear. The data matrix 200 will be discussed further with respect to FIG. 2.

Figure 2:
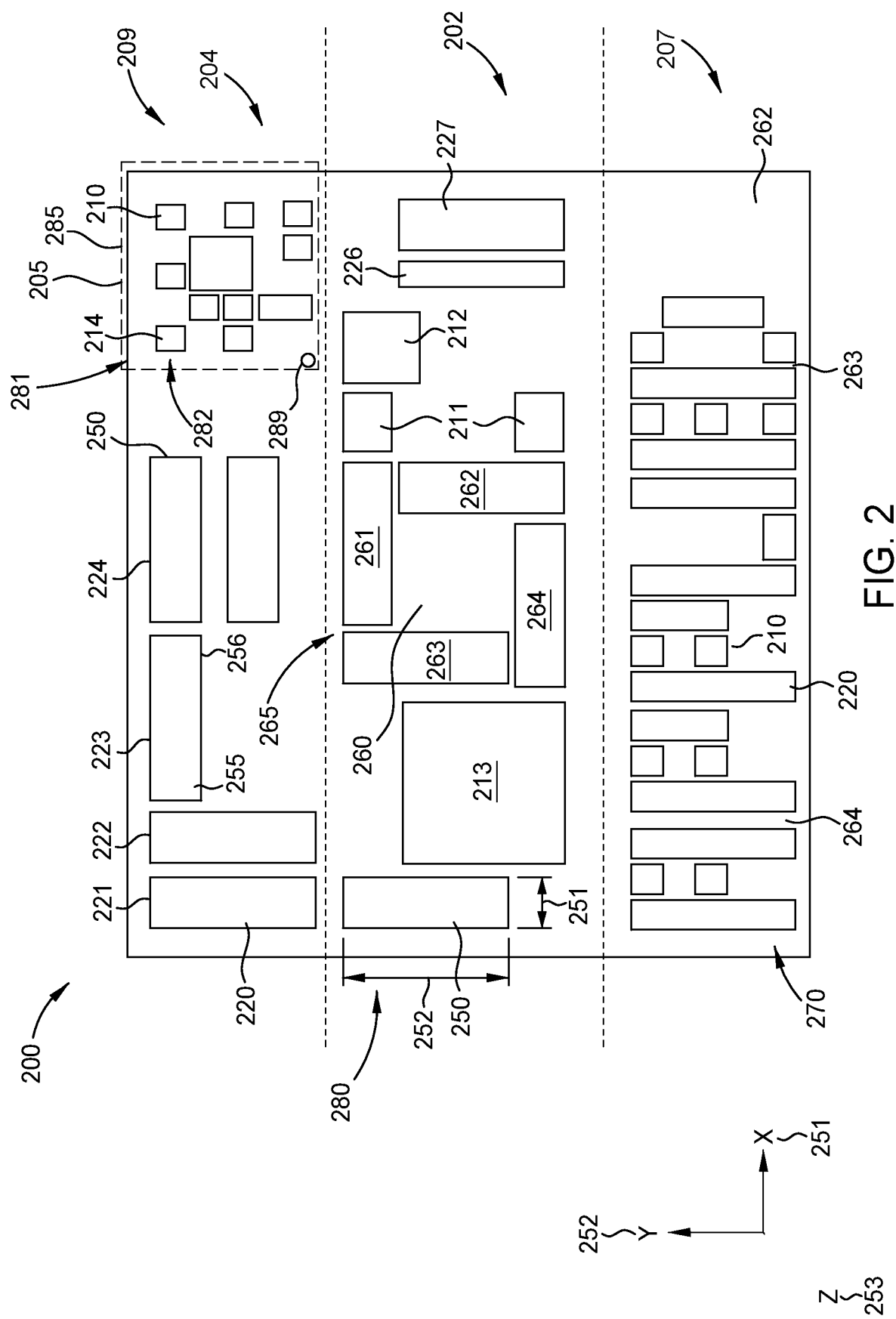
FIG. 2 illustrates a top plan view for the data matrix suitable for use on a consumable part for the processing chamber of FIG. 1.

FIG. 2 illustrates a top plan view of the data matrix 200 suitable for use on the chamber component 201 for the processing chamber 100 of FIG. 1. The data matrix 200 may be a multi-dimensional array with more than one level or dimension. For example, a 3D array, or multi-dimensional array, has an array of raised features 250 having a width (X) 251, a length (Y) 252 and a depth (Z-axis) 253. FIG. 2 is a 2D illustration of a 3D array of raised features 250 with the depth (Z-axis) 253 coming out of the page. The baseline for determining the depth 253 being the outer surface of the pre-engraved chamber component 201. The raised features 250 have a minimum depth 253 greater than about 10 um and a maximum depth 253 less than about 3 mm. In one example, the data matrix 200 is engraved onto the chamber component 201. The raised features 250 depth being the depth measured as a result of the engraving and can range from 10 um to multiple mm depending on the base chamber component 201 thickness or application.

The data matrix 200 has a data code 285 and a metrology code 280. The data code 285 includes information about the chamber component 201. The metrology code 280 has the raised features 250 used for determining the life of the chamber component 201. In one example, the data code 285 can function as the metrology code 280. In another example, the data code 285 is separate from the metrology code 280 and the data code 285 does not contain features measured for determining the part life. In yet another example, the metrology code 280 includes the data code 285.

The data matrix 200 may be divided into one or more sections 209 such as first section 204, second section 202 and third section 203. It should be appreciated however, the data matrix 200 may have any number of sections 209. Additionally one or more of the sections, such as first section 204, may have a subsection, such as subsection 205. Each section 209 may have a plurality of raised features 250. The raised features 250 may alternatively be recessed features, i.e., features depressed into the surface of the chamber component 201, or a combination of raised and recessed features. The raised features 250 are uniquely arranged in patterns to indicate wear from different processes performed in the processing chamber 100.

The raised features 250 have a plurality of different shapes. The raised features 250 may additionally have in a number of sizes. For example, one or more of the raised features may be shaped as a rectangle 220, and/or square 210. The one or more shapes may also be circles, triangular or other suitable shapes. The data matrix 200 additionally has open areas 260 defined adjacent the raised features 250. The open areas 260 may space the raised features 250 and create unique voids bounded by defined geometry. The open areas 260 may be large open areas 260, where the raised features 250 are spaced further than twice the sum of their widths across the open spaces 260. The open areas 260 may be wide spaces 264 between adjacent raised features 250, where the raised features 250 are spaced about their width across the open space 260. The open areas 260 may be narrow spaces 263 between adjacent raised features 250, where the raised features 250 are spaced less than their width across the open space 260.

The raised features 250 may have a variety of shape sizes as illustrated by large square 213 and small square 214. In the discussion that follows, the size of the raised features 250 may include reference to other raised features of dissimilar sizes. The following table is merely one example of how those sizes for the raised features 250 may relate to one another and should not be considered limiting. Where the small size may refer to the length, width, or area of the raised feature 250, a comparison between the sizes may be:

| Size | Relative Comparison |
| --- | --- |
| small | Small |
| medium | ~1.5-~3.5 > Small |
| large | ~4 or more > Small |

Additionally, size may have a different correspondence with respect to the aspect ratio between the length and width of the raised feature 250. For example, the raised features 250 may be wide, for example, rectangle 227, and narrow, for example, rectangle 226. For example, the raised feature 250 may have a narrow aspect ratio (length versus width) of less than 3. In another example, the raised feature 250 may have a medium aspect ratio (length versus width) of greater than 10. In yet another example, the raised feature 250 may have a large aspect ratio (length versus width) of between 3 and 10. The following table is merely one example of how those relative dimensions for the raised features 250 may relate to one another and should not be considered limiting.

| Feature | Aspect ratio | | |
| --- | --- | --- | --- |
| Square | Length = Width | 1:1 | |
| Rectangular | Length >>> Width | ~less than 3 | Narrow |
| | Length >> Width | ~3-~10 | Regular |
| | Length > Width | ~greater than 10 | Wide |

The raised features 250 may be a mix of shapes having a length 252 and a width 251. In one example, at least two adjacent raised features 250 have lengths 252 that are greater than widths 251 and the lengths 252 are parallel and face one another. Additionally, at least one raised feature 250 with the length 252 greater than the width 251 is adjacent one raised feature 250 with the length 252 smaller than the width 251, such that the two rectangular shaped raised features 250 appear perpendicular to each other and the length 252 of one raised feature 250 faces the width 251 of the second raised feature 250. However, it should be appreciated that the raised features 250 may be angled other than perpendicular or parallel from adjacent facing raised features 250. For example, the raised features 250 may have adjacent facing sides that are angled between about 0 degrees and about 90 degrees, such as about 45 degrees.

In some non-limiting examples, the matrix code 200 has two or more high aspect ratio adjacent raised features 250 having narrow widths and with lengths greater than the width. The matrix code 200 has a narrow space 260 between the two or more high aspect ratio adjacent raised features 250 arranged facing each other in the length side. In another non-limiting example, the matrix code 200 has two or more low aspect ratio adjacent raised features 250 having narrow widths and with lengths greater than the width. The matrix code 200 has a narrow space 260 between the two or more high aspect ratio adjacent raised features 250. In yet another non-limiting example, the matrix code 200 has two or more medium aspect ratio adjacent raised features 250 having wide widths and with lengths greater than the width arranged facing each other in the width side. The matrix code 200 has a wide space 260 between the two or more medium aspect ratio adjacent raised features 250. In yet another non-limiting example, the matrix code 200 one medium aspect ratio raised feature 250 having narrow widths and with lengths shorter than the width adjacent to a second large aspect ratio raised feature 250 having wide widths and with lengths longer than the width. The matrix code 200 has a medium space 260 between the two or more adjacent raised features 250. Thus, it should be appreciated, the matrix code 200 can have a number of raised features 250 each having a different aspect ratio, length, width, orientation and spacing from adjacent raised feature all forming the matrix code 200.

The raised features 250 in each section 209 may contain a code that is machine-readable or human readable. In one example, subsection 205 is provided with the data code 285 to uniquely identify the chamber component 201. The data code 285 is made of raised features 250 that are arranged in a predetermined identifiable pattern. The data code 285 may contain information linkable to a database containing information about the chamber component 201. For example, the data code 285 may link to information in the database containing a serial number and performance information about the consumable part 201 identified by the data code 285. The number of rows 282 and columns 281 may increase with the amount of information directly stored in the data code 285. Alternately, the data code 285 provides an identifier linking to a database where the information may be retrieved. The data code 285 is readable by a scanner to identify the consumable chamber component 201. The data code 285 may be identified by the scanner by a pattern of the raised features 250 having a unique orientation, such as an arrangement of features having shapes or sizes not found in the data matrix 200 of other chamber parts. In one example, a circle feature 289 or other group of features may be positioned to identify the data code 285 in the data matrix 200. For example the a circle feature 289 or other group of features may indicate a lower left-hand corner of the data code 285 to the scanner. It should be appreciated that the data code 285 may be located anywhere in the data matrix 200.

The raised features 250 may be arranged in a pattern that is recognizable to a person handling the chamber component 201. In one example, the raised features 250 in the third section 203 are human readable. The raised features 250 may have an arrangement of rectangles 220 and squares 2102 spell out or otherwise provide a word, number, code or marker that may be able to identify the consumable chamber component 201 merely by visual inspection. For example, a word 270 identifying the part or manufacture may be visible and discernible through observation of the multidimensional array 200. The word 270 may spell out more than a single word and even may spell out part numbers, serial numbers, or other useful information.

The raised features 250 have a depth 253 (in the Z direction) of at least 10 um so that the raised features 250 may be monitored for changes indicative of wear. The raised features 250 in the metrology code 280 are arranged to facilitate monitoring for indicating part life. It should be appreciated that the data code 285 may alternately or additionally be monitored for indicating part life. As the data matrix 200 is exposed to plasma, cleaning agents, corrosive gases or other processes, the raised features 250 may be eroded in a direction of any one of the width 251, length 252 or depth 253. The raised features 250 in the third section 203, in the second section 202, or the first section 204 may be measured, or scanned, in situ or with a metrology tool to detect changes in the width 251, length 252 or depth 253. The features in the data matrix 285 or the word 270 may likewise the measured to provide an indication of wear and an estimation of the remaining life for the chamber component 201.

The raised features 250 may be placed throughout the data matrix in patterns such that the spacing and the size of the raised features 250 are varied. For example, a first large rectangle 221 may be arranged parallel to a second large rectangle 222 along the longest edge of the raised features 250. A third large rectangle 223 may be orthogonal to the second large rectangle 222 such that the longest edge of the third large rectangle 223 is parallel and facing the shorted edge of the second large rectangle 222. A fourth large rectangle 224 may be aligned with the third large rectangle 223 such the shortest edges of the fourth and third large rectangles 224, 223 are directly facing and parallel to each other. The varied spacing, arrangement and sizing provides comprehensive information as wear occurs differently on different component geometry, thus making the analysis of the data more representative of real life wear and tear.

A first pattern 265 illustrates four large rectangles 261, 262, 263, 264 arranged as a larger rectangle bounding the open area 260 in the middle. The raised features 250 may have narrow rectangles 226 adjacent to wide rectangles 227. It should be appreciated that the narrow rectangles 226 could be orthogonal to the wide rectangles 227. Similarly, a plurality of square features 210 may be arranged in different sizes and different configurations as illustrated by large square 213, small square 214 and intermediate squares 211 and 212. Thus, the arrangement of raised features 250 can be made such that the exposure for a top 255 and/or a side 256 of the raised features 250 are varied throughout the multidimensional array 200.

The data matrix 200 is a permanent part to the chamber component 201 and may be used for tracking the part and providing the status as well as a predictor of the life for the chamber component 201. Every chamber component 201 has its process and quality sensitive parameters measured and recorded as a key performance component (KPC) or as a certification of acceptance (COA) when the chamber component 201 is in a new condition. The KPC features, such as hole size, dimensions, etc. . . . influence chamber process conditions such as plasma and deposition/etch rates. The dimensions of the raised features 250 are measured when the chamber component 201 is in the new condition. The data matrix 200 is placed outside of the chamber process area (non-plasma facing) such to capture the non-chamber related influence like refurbishment/recycle clean processes on the chamber component 201. The raised features 250 placed inside of the chamber process area (plasma facing) capture the chamber related influence such as erosion from etchants and particle buildup from deposition processes on the chamber component 201.

KPC parameters are influenced by chamber processes and the cleaning processes. The raised features 250 of the data matrix 200 are influenced by the cleaning process and chamber processes such as etching or deposition. By comparing the KPC and the metrology of the raised features 250 values (stored in centralized database), the influence of chamber and clean process can be decoupled for providing an indicator of the life expectancy of the chamber component 201. The geometry of the raised features 250 (e.g. hole size/dimension) can be monitored to ensure the process performance is maintained through the life of the chamber component 201. The data matrix 200 is a strong indication that key features of the part might have been worn or damaged during refurbishment or cleaning. The chamber component 201 may be retired if the metrology of the raised features 250 in the data matrix 200 are no longer within specification.

FIGS. 3A and 3B depict a random cross-section of the data matrix 200 of FIG. 2. FIGS. 3A and 3B is a 2D illustration of the raised features 250 of the data matrix 200 with the height (Y) 252 coming out of the page. As shown in FIG. 3A, the data matrix 200 may be formed on an outer surface 207 of the chamber component 201. As shown in FIG. 3B, the data matrix 200 may be formed into the outer surface 207 of the chamber component 201 creating openings 257 into the outer surface 207. It should be appreciated that the data matrix 200 may contain a combination of the raised features 250 as well as the recessed features 257, i.e., have portions of the raised features 250 above and recessed features 257 below the outer surface 207. In operation, there are differences between the data matrix 200 being formed onto the outer surface 207 and being formed into the outer surface 207. For example, raised features 250 may affect performance of the part and are harder to form while being easier to read and less prone to clogging than recessed features 257. However, the operation of these features are similar with respect to the methods disclosed below and in describing one feature it should be appreciated that the technical effects apply to the other as well. Thus, further discussion will be with respect to the raised features 250 for simplicity and brevity.

A depth 310 along the Z-axis 253 is measured for each raised feature 250. In determining the depth 310, the depth 310 is measured relative to the outer surface 207. Alternately, the depth 310 may be measured from a centerline (not shown) of the chamber component 201. Additionally, a width 320 is measured along the X-axis 251 and a length 330 is measured along Y-axis 252 for each raised feature 250. The raised features 250 may be formed having different heights, i.e, the depth 310 and a second height 242. Likewise, the raised features may be formed with different widths 320 and lengths 330.

The raised features 250 may become eroded, etched, polished or worn by other techniques such that a second height 245 may be different from the original depth 310 of the raised feature when new. Likewise, corners 240 and edges of the raised features 250 may become worn or smoothed 241, such as rounded or chamfered, or otherwise loose material. One or more sidewalls 351 of the raised features 250 may also be etched or worn away a distance 243 to a new sidewall 352 such that the width 320 of the raised feature 250 is smaller than originally formed.

In other examples, a material 249 may be deposited in between the raised features 250 or in the openings 257. The deposited material 249 may reduce the depth 310 of the adjoining raised features 250. The deposited material may favorably accumulate along the sidewalls 351 to enlarge the raised features 250 in either the length 330 or the width 320 direction as well.

Thus, it can be seen that the raised features 250 may change in size and shape over time due to use in the process chamber and cleaning. In operation, processing alters the size and shape of the raised features 250 in the data matrix 200. The chamber component 201 may be measured and identified along with the data matrix 200 prior to the chamber component 201 being introduced to the plasma processing chamber 100.

Figure 4:
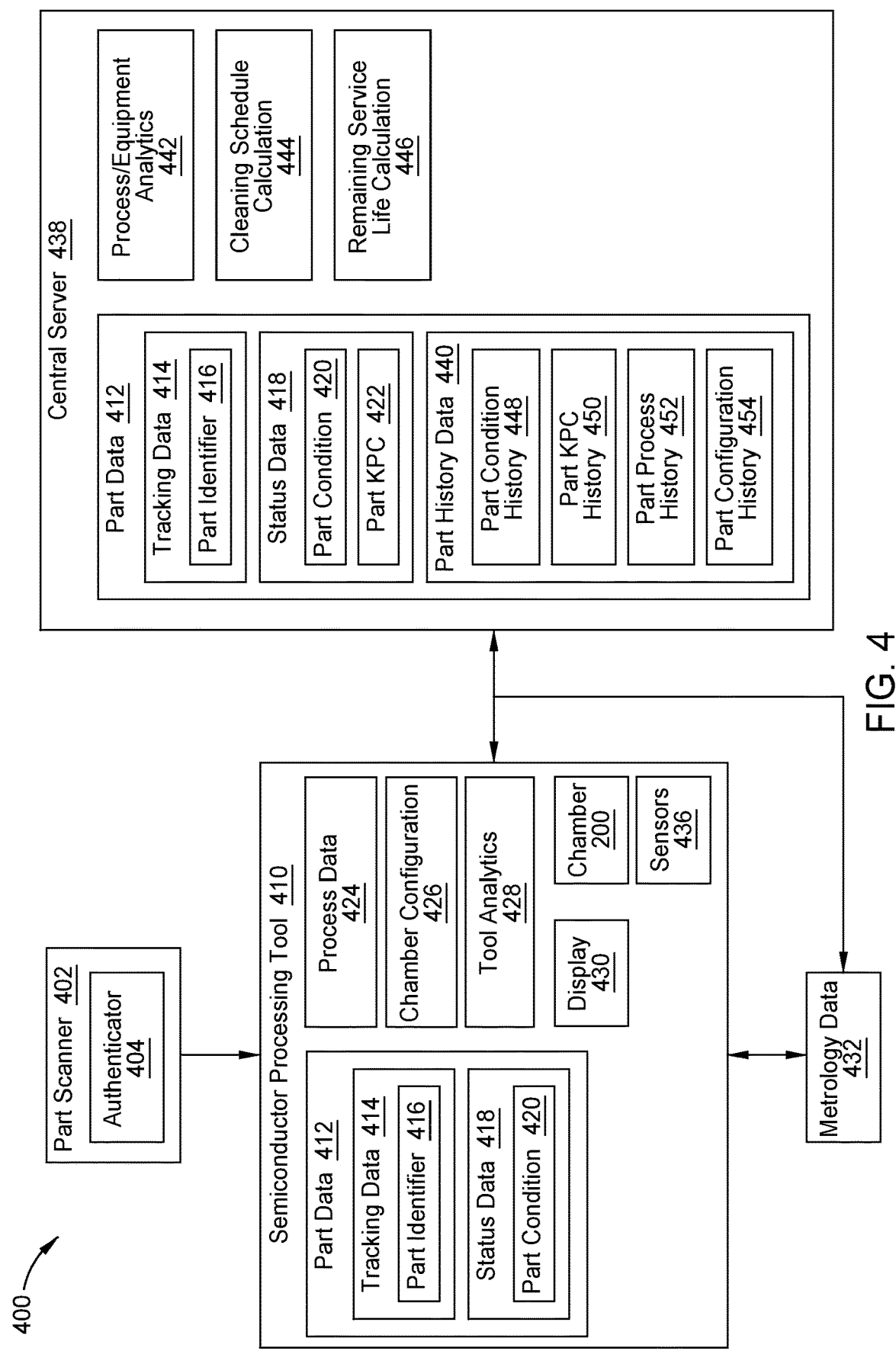
FIG. 4 depicts a system for tracking the consumable part and its status, to improve the operation of the processing chamber of FIG. 1.

FIG. 4 depicts a system 400 for tracking the chamber component 201 and its status, to improve the operation of the processing chamber 100 of FIG. 1. The system 400 has a part scanner 402, a semiconductor processing tool 410 and a central server 438. The semiconductor processing tool 410 includes processing chamber 100.

The part scanner 402 is provided to obtain information from the chamber component 201 or a label accompanying the chamber component 201, and is communicatively coupled to the tool 410 via one or more of a PC controller, a factory interface, a system controller, or other system associated with a tool 410. Additional part scanners 402 may be coupled to a central server 438 (discussed below), and to systems located at parts suppliers, and vendors (e.g., cleaning vendors).

By way of example, the part scanner 402 obtains information identifying a part from the data matrix 200. As discussed above, the data matrix 200 may carry or encode a unique identifier for the chamber component 201. The data code 285 of the data matrix 200 includes a part number, a part serial number, and a supplier ID. One or more of the part number, part serial number, and supplier ID are combined into a unique data code 285 via a hash algorithm. The data matrix 200 may be engraved in the chamber component 201, or be affixed to the chamber component 201. Information such as part number, serial number, and supplier ID associated with the data code 285 in the data matrix 200 and is stored within the semiconductor processing tool 410 ("tool") and/or the central server 438. The part scanner 402 may be configured to produce the tracking code in the form of the data matrix 200 to be affixed to the chamber component 201, receiving the tracking code information from one of the tool 410 and the central server 438.

The part scanner 402 may include an authenticator 404. The authenticator 404 receives the data matrix 200, decodes it using an algorithm, to a part number, a part serial number, and a supplier ID, that in turn are compared to known part number/serial number/supplier ID combinations in the tool 410 or central server 438, to authenticate the chamber component 201. An authenticated chamber component 201, in some embodiments, is a part that has been approved for use in the processing chamber 100 by the manufacturer of the processing chamber 100. However, it should be appreciated that the system 400 may not prevent the chamber component 201 from being used in the processing chamber 100 if authentication of the chamber component 201 is not possible or the fails authentication. For non-authenticated chamber component 201, part information, status, condition history, and other data, and analytics that rely on that data may still be available and stored in the system 400.

In some embodiments, the part scanner 402 is a dedicated scanning device, for example, a metrology tool such as an optical microscope, a camera or a barcode scanner, or other sensor. Additionally, the scanning function may be carried out by a device whose primary function is not scanning parts, such as a mobile computing device (e.g., mobile phone, tablet, etc.). However, as will be discussed further below, the part scanner 402 in practice is suitable for reading and recording the metrology information of the data matrix 200. For the data matrix 200 as a metrology feature, all features are measured in new condition and post cleaning/refurbishment.

The semiconductor processing tool 410 may be any type of semiconductor processing equipment, a heterogeneous or homogeneous collection of such equipment, or a production facility comprised of a plurality of semiconductor processing tools. The tool 410 stores part data 412. Part data 412 includes tracking data 414 that includes a part identifier 416. In embodiments, part identifier 416 includes a part number, a part serial number, and a supplier ID that are acquired from the data matrix 200 via the part scanner. In some embodiments, part identifier 416 may be authenticated on the tool 410 in a manner similar to authenticator 404 of the scanner, while in other embodiments authentication may occur on the central server 438, again, in a manner similar to authenticator 404.

In embodiments, part data 412 further includes status data 418. Status data 418 stores or encodes information pertaining to the condition of a part. Status data 418 includes a part condition 420 and a part Key Performance Characteristic (KPC) 422, and may include additional data reflecting the status of a part. The status data 418 may additionally be provided from examining the metrology of the data matrix 200.

Part condition 420 includes information regarding the physical condition of the part, data regarding the number of wafers a chamber configuration 426 comprising the part has processed, processing conditions of the processing chamber 100 to which the part has been exposed. Part condition 420 may additionally include whether or not a part is clean, RF hours, wafer count, number of times the part has been refurbished, and may include data reflecting calculations of buildup/wear on the part based upon process conditions. The data matrix 200 may be used as metrology feature. The data matrix 200 is measured in new condition and post cleaning/refurbishment. The measurements/metrology of the data matrix 200 is recorded as the part condition 420.

Part KPC 422 includes one or more attributes of the part, such as one or more of flatness, roughness, and thickness of a part at the time of placement in the chamber configuration 426 (e.g., initial use of a new or cleaned part) or estimated as a result of processing conditions in the tool 410. The part KPC 422 may be at least partially derived from measuring the metrology of the data matrix 200. The part KPC 422 may additionally include equipment condition (e.g., in terms of operating temperature parameters, time in operation, and the like) for production and/or cleaning of the part. At least a portion of the part condition 420 and/or part KPC 422 may be acquired from the status code 408. The status data 418, as well as part condition 420 and/or part KPC 422 may be communicated to the central server 438, or receive updates to the part condition 420 and/or part KPC 422 from the central server 438.

In embodiments, the tool 410 stores, or has access to, process data 424. Process data 424 includes data on the semiconductor process employed in the processing of wafers in the tool 410. This may include data on what type of process (e.g., CVD, PVD, epitaxial, ALD, etc.), the number of wafers processed, processing chamber 100 conditions generally, and/or within particular regions of the processing chamber 100 (e.g., temperature, pressure, gas flow rate, radiation density/intensity, RF signal strength, optical/visual data), wafer condition data, semiconductor device/structure data (e.g., metrology). Process data 424 is included as part of the part condition 420. In some embodiments, process data 424 is communicated to the central server 438.

The tool 410 stores, or can access, a chamber configuration 426. Chamber configuration 426 is a listing of parts present in a given chamber of the tool and includes part identifier 416 and/or status data 418 of one or more parts placed into the tool. The parts to which a particular part identifier 416 is associated with is placed into a physical processing chamber 100 of the tool 410. A display 430 may be configured to visually indicate parts in the chamber configuration 426, by displaying one or more of the part identifier 416, part condition, 420, and part KPC.

The tool 410 stores, or can access, tool analytics 428. Tool analytics 428 includes data regarding the processing conditions of tool 410, and in some embodiments receives data from one or more of part identifier 416, part condition 420, part KPC 422, process data 424, and chamber configuration 426. Data included in tool analytics 428 may be displayed to a user via display 430. In embodiments, tool analytics 428 includes one or more algorithms that use data from one or more part condition 420, process data 424, chamber configuration 426, and metrology data 432 (discussed below) to predict when a part would need to be cleaned or replaced.

The system 400 may optionally store or access metrology data 432, in communication with the tool 410, obtained from one or more sensors 436 associated with the tool 410, in connection with processing wafers in the processing chamber 100. Metrology data 432 may be communicated to the central server 438 in some embodiments.

The central server 438 stores or can access part data 412, part history data 440, processing equipment analytics 442, cleaning schedule calculation 444, and remaining life calculation 446. The central server 438 may accompany the tool 410 at a customer facility, or be located remotely at a different customer site, a vendor site, tool manufacturer facility, and accessed via a secure network. The central server 438 may be a single computer system, multiple computer systems (located together or distributed), or may be exist virtually in a cloud computing environment, or a combination of these.

Part history data 440 includes part condition history 448. Part condition history 448 receives data from part condition 420, as part condition 420 changes, storing the changes as time-series data. As discussed above, a part condition 420 may change as a result of a part being placed in an operating tool 410, or by a cleaning vendor who updates the condition of the part after cleaning. The part condition history 448 keeps time series data of part condition 420.

Part history data 440 includes part KPC history 450. Similar to part condition history 448, part KPC history 450 is time-series data of the part KPC 422, updated as the part KPC 422 changes.

Part history data 440 includes part process history 452. Part process history 452 is a time series record storing the process data 424 of the tool 410 during the time that the part was in the chamber configuration 426. In some embodiments, only process data 424 related to the part is recorded in the part process history 452, while in other embodiments, all process data 452 generated while the part was part of the chamber configuration 426 is recorded as part process history 452. In one example, the part history 440 may store data to analyze the continues wear of a chamber component 201 for making a determination when the chamber component 201 may need to be replaced or refurbished.

Part history data 440 includes part configuration history 454. Part configuration history 454 is a time series record storing the chamber configuration 426 of the tool 410 during the time that the part was part of the chamber configuration 426, and may include one or more other parts that were in the chamber configuration 426 concurrently.

Processing equipment analytics 442 of the central server 438 takes as input one or more of part data 412, part history data 440, process data 424, chamber configuration 426, tool analytics 428 and metrology data 432. Using this data, process equipment analytics 442 measure performance of a particular tool or class of tools, and generate recommendations to update a particular tool or class of tools, or their processes/recipes, to operate more effectively.

Central server 438, in embodiments, includes the cleaning schedule calculation 444. Although parts suppliers, tool manufacturers, and tool owners may estimate cleaning cycles for a given part that is used in a particular process, cleaning schedule calculation 444 may be used to more accurately determine when a part needs to be cleaned. Cleaning schedule calculation 444, takes as input, for example, tracking data 414, status data 418, part history data 440, and uses one or more of these components to identify an impact of the cleanliness of a part on a semiconductor processing step (or recipe) being run by the tool, to accurately determine when a part needs to be cleaned. This enables the tool operator to continue to operate the tool 410 as long as possible, or, identify potential problems with a part early, before losing too many wafers to excursions of defects.

In embodiments, central server 438 may include a remaining service life calculation 446. Although parts suppliers, tool manufacturers, and tool owners may provide estimates as to when a part being used in the tool 410 should be retired, the actual service life of a part can vary depending upon the chamber configurations and semiconductor processes in which the part has been a part of. Remaining service life calculation 446, in embodiments, takes input data from one or more of part data 412 and part condition history 440, and calculates the useful remaining life of a part, for example, in terms of the number of wafers to be processed.

Figure 5:
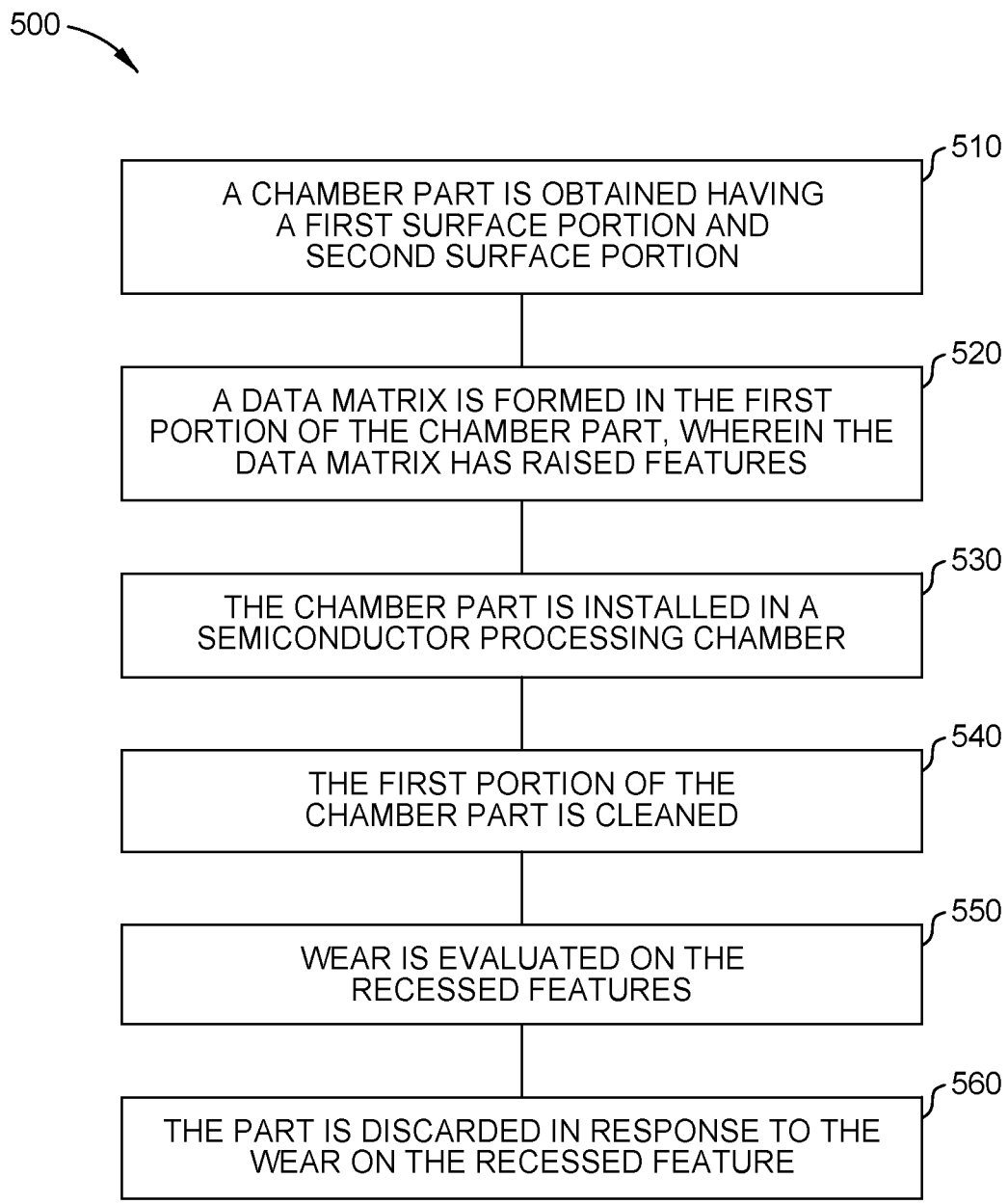
FIG. 5 depicts a method for estimating the life remaining for chamber components used in semiconductor processing chambers.

FIG. 5 depicts a method 500 for estimating the life remaining for the chamber components 201 used in the semiconductor processing chambers 100. The chamber component 201 is encoded with the data matrix 200 disclosed above. The method 510 begins by obtaining a chamber part having a first surface portion and second surface portion, such as chamber component 201.

At operation 520, the data matrix 200 formed in the first portion of the chamber part is read, wherein the data matrix has raised features. The raised features are three dimensional and formed into the material of the chamber part. Alternately, the raised features are three dimensional and formed onto the material of the chamber part. The raised features of the data matrix are suitable for scanning, i.e., reading, to determine coded information and to track the overall health of the chamber component 201. The tracking data of the chamber component 201 is scanned from the data matrix 200 into a semiconductor processing tool or a central server.

The data matrix 200 accompanying the chamber component 201 is scanned to acquire a tracking code and a status code embedded in the data matrix 200. The data matrix 200 has both the metrology code 280 and the data code 285. The data code 285 uniquely identifies the chamber part, the tracking code and a status code of the chamber part. A part serial number, part number, and supplier identifier are encoded in the data matrix 200 as the data code 285. The metrology code 280 is additionally measured when scanned. The data code 285 along with the information for the metrology code 280 may be stored in a database. The data code 285 tracks and identifies the chamber component 201 (e.g., what type of part, supplier, etc.). When the part is new and first received by a customer, its status is new, and it has no use history as the new part has not been used in any semiconductor processing. In the new part, the data matrix 200 would show no wear and the recording of the metrology for the raised features 250 disposed in the metrology code 280 portion of the data matrix 200 are stored with the tracking data.

At operation 520, the chamber part is installed in the semi-conductor processing chamber. The status data of each part is updated to reflect the chamber it is installed into. The processing chamber is operated to process semiconductor products. The processing chamber additionally has cleaning operations. As the part is used in the tool, the part status is updated to reflect the processing of the tool in which it is installed, and a part condition history will be stored as well as the status changes. This information may be stored in the tool as well as the central server. All process and metrology data from measuring the features in the metrology code may be update the status data for the chamber component 201.

At operation 530, the first portion of the chamber part 201 is cleaned. The first portion surface is exposed to process chemicals, and a second surface portion may not be exposed to the process chemicals. Alternately, the second surface portion is exposed to process chemicals, and the first surface portion is not exposed to the process chemicals. In yet other examples, both the first portion and the second portion are exposed to the process chemicals.

Cleaning of the chamber component 201 may be performed with a cleaning gas in-situ between each chamber processing operation or after a number of substrates are processed. Alternately, cleaning of the chamber component 201 may be performed outside the process chamber. The cleaning may also be performed as part of chamber maintenance. During cleaning operations, the metrology code 280 disposed on the first portion of the chamber part is affected by both the chamber processing and the cleaning operations. For example, during deposition operations, the data matrix 200 may accumulate material between the raised features 250. During etch operations, the raised features 250 may become etched down and/or rounded. During cleaning operations, the raised features 250 may additionally become worn away similar to the etch operations. Furthermore, the cleaning operations may not remove all deposited material from the raised features 250 while still wearing the raised features 250 down. The orientation, spacing and sizing of the raised features 250 provide a complex surface for determining the condition of the chamber component 250 by having a variety of surfaces and exposures for the process to react with, i.e., wear away or get trapped therein.

At operation 540, wear on the recessed and or raised features are evaluated. The raised features 250 in the metrology code 280 portion of the data matrix 200 are measured. For qualitative comparison, a camera or a barcode scanner could serve as a sensor for a fast-pace scan. For quantitative comparison, OM (optical microscope) and/or AOI (Auto Optical Inspection) would be the proper metrology tools to detail out the change of shape/trench profile and hole dimension of the metrology code 280. The measurement may be performed in situ with the sensor or other suitable scanner. Alternately, the measurement of the raised features 250 may be performed outside the chamber with the metrology tool.

In one example, when a chamber component is due for a cleaning, the tool operator may remove the chamber component from the chamber, scanning it with the part scanner or metrology tool to identify the removed part and capture the metrology of the data matrix. The raised features are measured for alterations in the height, width, and length. The edges are additionally inspected and measured for rounding or other signs of wear. The measurement of the raised features are compared to a baseline measurement of the raised features for the chamber part when it was new. A range of permitted wear is established corresponding to key performance indicators for the chamber part based on processing conditions to estimate remaining part life. The raised features are measured to ensure they are all within the range of wear permitted. Changes in the data matrix may be provided to the central server. If the wear of the data matrix is within the acceptable range, the consumable part is returned to service and the wear is noted to predict the life expectancy of the chamber component. For example, the wear of the chamber component 201 may indicate another 200 hours of service life for the chamber component 201.

At operation 550, the chamber component 201 is discarded responsive to the wear on the raised feature. The determination is made based on the metrology of the data matrix showing wear beyond the acceptable range. The chamber component 201 is determined to be at its end of life. If the determination is made that the part is at its end of life, the status data is updated to reflect this state, and the chamber component 201 is retired. Alternately, the chamber component 201 may be sent to be refurbished. After refurbishing, the chamber component 201 may be re-measured to ensure compliance with critical dimensions. In some examples, a new data matrix may be provided on the chamber component 201 for measuring wear and indicating the part life.

Figure 6:
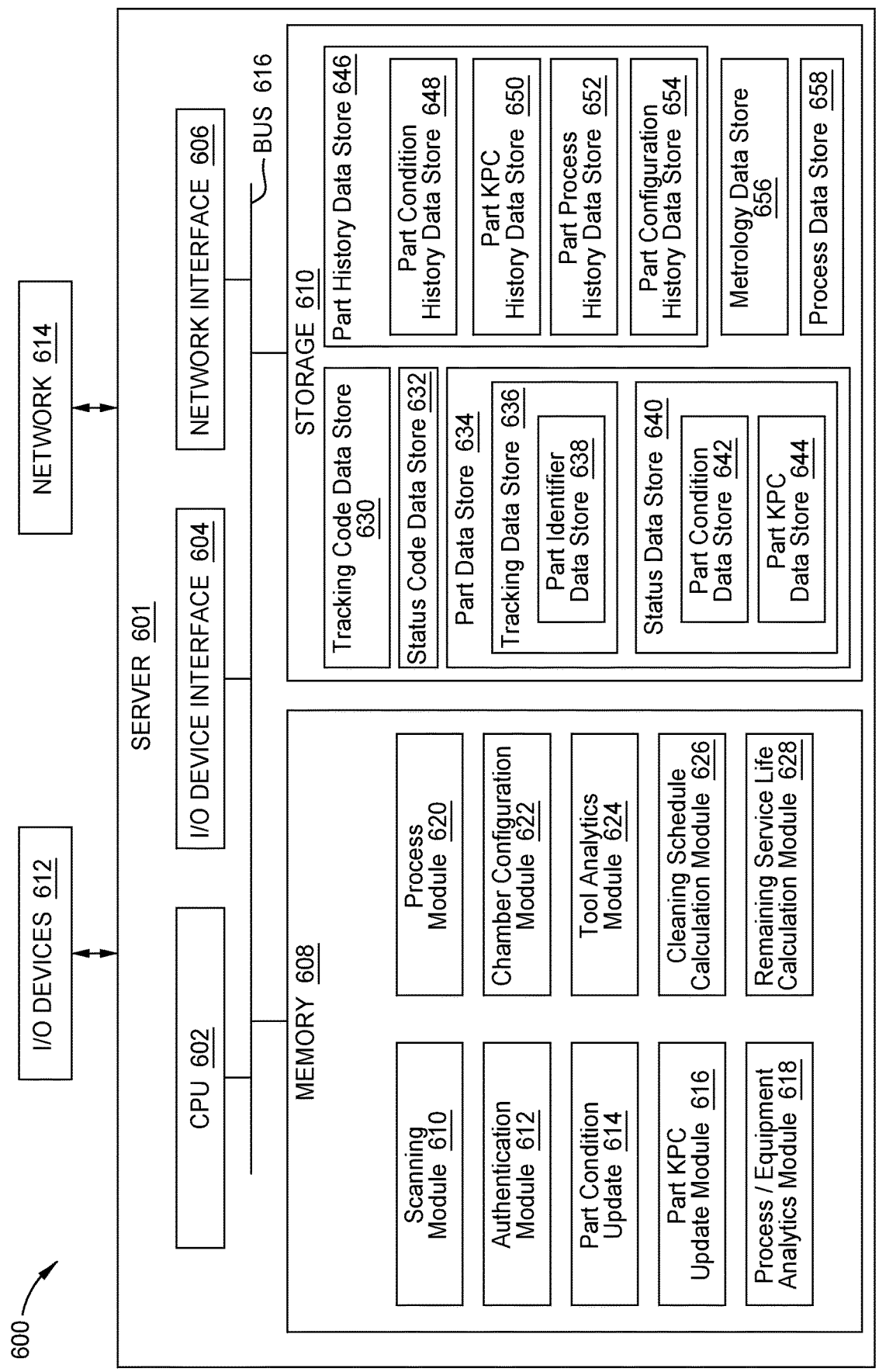
FIG. 6 depicts a processing system for improving the operation of semiconductor processing, according to an embodiment.

FIG. 6 depicts a processing system for improving the operation of semiconductor processing, according to an embodiment. Processing system 600 includes a CPU 602 connected to a bus 616. CPU 602 is configured to process computer-readable instructions, such as stored in memory 608 and/or storage 610 and to cause processing system 600 to perform the methods as described herein. CPU 602 is included to be representative of a single CPU, multiple CPU's, a single CPU having multiple processing cores, and other forms of processing architecture capable of executing computer-readable instructions. In some embodiments, CPU 602 may be located, in whole or in part, remotely and accessed via a network.

Processing system 600 includes an I/O device interface 604 to provide access to I/O devices 612 and a network interface 606 to provide access to a network 614. Processing system 600 further includes a memory 608, which in embodiments includes a plurality of modules. The processing system 600 may be a single system, however in embodiments comprises multiple discrete systems, such as described above with regard to part scanner 402, tool 410, metrology data 432, and central server 438.

By way of example, memory 608 includes a scanning module 610 that is configured to perform scanning operations as described above. Memory 608 further includes an authentication module 612 that is configured to perform authentication operations as described above. Memory 608 further includes a part condition update module 614 that is configured to update a part condition as described above. Memory 608 further includes a part KPC update module 616 that is configured to update a part KPC as described above. Memory 608 further includes a process/equipment analytics module 618 that is configured to perform process/equipment analytics as described above. Memory 608 further includes a process module 620 configured to perform tool processing operations as described above. Memory 608 further includes a chamber configuration module 622 configured to perform chamber configuration operations as described above. Memory 608 further includes tool analytics module 624 configured to perform tool analytics as described above. Memory 608 further includes a cleaning schedule calculation module 626 configured to perform cleaning schedule calculations as described above. Memory 608 further includes a remaining service life calculation module 628 configured to perform remaining service life calculations as described above.

Note that while shown as a single memory 608 in FIG. 6 for simplicity, the various aspects stored in memory 608 may be stored in different physical memories, but all accessible to CPU 602 via internal data connections such as bus 616. Alternatively, various aspects stored in memory 608 may be stored in one or more physical memories located outside of the processing system 600 and accessed via the network 614.

Server 601 includes a storage 610, which in embodiments includes a tracking code data store 630. Tracking code data store 630 may be related to data matrix 200 of FIG. 2. Storage 610 further includes a status code data store 632, which may be related to the status code.

Storage 610 further includes a part data store 634, which includes tracking data store 636, part identifier data store 638, status data store 640, part condition data store 642, and part KPC data store 644. The part data store 634, and its components may be related to part data 412, tracking data 414, part identifier 416, status data 418, part condition 420, and part KPC 422, respectively, of FIG. 4. Storage 610 further includes a part history data store 646, which includes part condition history data store 648, part KPC history data store 650, Part process history data store 652, and part configuration history data store 454. The part history data store 646, and its components may be related to part history data 440, part condition history 148, part KPC history 450, part process history 452, and part configuration history 454, respectively, of FIG. 4. Storage 610 further includes a metrology data store 656, which may be related to metrology data 432 of FIG. 4. Storage 610 further includes a process data store 658, which may be related to process data 424 of FIG. 4.

The preceding description is provided to enable any person skilled in the art to practice the various embodiments described herein. The examples discussed herein are not limiting of the scope, applicability, or embodiments set forth in the claims. Various modifications to these embodiments will be readily apparent to those skilled in the art, and the generic principles defined herein may be applied to other embodiments. For example, changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. In addition, features described with respect to some examples may be combined in some other examples. For example, an apparatus may be implemented or a method may be practiced using any number of the aspects set forth herein. In addition, the scope of the disclosure is intended to cover such an apparatus or method that is practiced using other structure, functionality, or structure and functionality in addition to, or other than, the various aspects of the disclosure set forth herein. It should be understood that any aspect of the disclosure disclosed herein may be embodied by one or more elements of a claim.

As used herein, the term "determining" encompasses a wide variety of actions. For example, "determining" may include calculating, computing, processing, deriving, investigating, looking up (e.g., looking up in a table, a database or another data structure), ascertaining and the like. In addition, "determining" may include receiving (e.g., receiving information), accessing (e.g., accessing data in a memory) and the like. In addition, "determining" may include resolving, selecting, choosing, establishing and the like.

The methods disclosed herein comprise one or more steps or actions for achieving the methods. The method steps and/or actions may be interchanged with one another without departing from the scope of the claims. In other words, unless a specific order of steps or actions is specified, the order and/or use of specific steps and/or actions may be modified without departing from the scope of the claims. Further, the various operations of methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components with similar numbering.

The following claims are not intended to be limited to the embodiments shown herein but are to be accorded the full scope consistent with the language of the claims. Within a claim, a reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims.

What is claimed is:

1. A method of part life estimation, comprising:
    obtaining a chamber part of a semiconductor processing chamber having a first surface portion and a second surface portion, the first surface portion having a data matrix with one or more raised features;
    cleaning at least the first surface portion of the chamber part;
    evaluating wear on the raised features of the data matrix; and
    discarding the part responsive to the wear on the raised features of the data matrix.

2. The method of claim 1, wherein the raised features are three dimensional and formed into a material of the chamber part.

3. The method of claim 2, wherein the first surface portion is exposed to process chemicals in a process chamber, and the second surface portion is not exposed to the process chemicals in the process chamber.

4. The method of claim 2, wherein the second surface portion is exposed to process chemicals in a process chamber, and the first surface portion is not exposed to the process chemicals in the process chamber.

5. The method of claim 2, wherein evaluating wear on the raised feature further comprises:
    measuring the raised features; and
    comparing the measurements of the raised features to a baseline measurement of the raised features for the chamber part.

6. The method of claim 5, further comprising:
    comparing the measurements of the raised features to a range corresponding to key performance indicators for the chamber part based on processing conditions to estimate remaining part life.

7. The method of claim 6, wherein the data matrix has an identification matrix code and wherein the identification matrix code uniquely identifies the chamber part and a status of the chamber part.

8. A non-transitory computer-readable medium comprising instructions that, when executed by a processor of a processing system, cause the processing system to perform a method for improving operation of semiconductor processing system, the method comprising:
    obtaining a chamber part of a semiconductor processing chamber having a first surface portion and a second surface portion, the first surface portion having a data matrix with one or more raised features;
    cleaning at least the first surface portion of the chamber part;
    evaluating wear on the raised features of the data matrix; and
    discarding the part responsive to the wear on the raised features of the data matrix.

9. The non-transitory computer-readable medium of claim 8, wherein the raised features are three dimensional and formed into a material of the chamber part.

10. The non-transitory computer-readable medium of claim 9, wherein the first surface portion is exposed to process chemicals in a process chamber, and the second surface portion is not exposed to the process chemicals in the process chamber.

11. The non-transitory computer-readable medium of claim 9, wherein the second surface portion is exposed to process chemicals in a process chamber, and the first surface portion is not exposed to the process chemicals in the process chamber.

12. The non-transitory computer-readable medium of claim 9, wherein evaluating wear on the raised feature further comprises:
    measuring the raised features; and
    comparing the measurements of the raised features to a baseline measurement of the raised features for the chamber part.

13. The non-transitory computer-readable medium of claim 12, further comprising:
    comparing the measurements of the raised features to a range corresponding to key performance indicators for the chamber part based on processing conditions to estimate remaining part life.

14. The non-transitory computer-readable medium of claim 13, wherein the data matrix has an identification matrix code and wherein the identification matrix code uniquely identifies the chamber part and a status of the chamber part.

15. A chamber part for a semiconductor processing chamber, the chamber part comprising:
    a body having a first surface portion and a second surface portion; and a data matrix formed in the first surface portion of the chamber part, wherein the data matrix has three dimensional (3D) features, the data matrix comprising;
an identification matrix code; and
a metrology code.

16. The chamber part of claim 15, wherein the features are three dimensional and formed into a material of the chamber part.

17. The chamber part of claim 15, wherein the features are three dimensional and raised away from a material of the chamber part.

18. The chamber part of claim 15, wherein the identification matrix code uniquely identifies the chamber part and a status of the chamber part.

19. The chamber part of claim 15, wherein the identification matrix code is smaller than the metrology code and the features of the metrology code are a mix of rectangular shapes having a length and a width, wherein the metrology code comprises:
   at least two adjacent raised features having lengths that are greater than widths and the lengths are parallel; and
   at least one raised feature with the length greater than the width is adjacent one raised feature with the length smaller than the width.

20. The chamber part of claim 19, wherein the data matrix further comprises:
   a human readable code formed from the 3D features.

* * * * *